United States Patent [19]
Popat et al.

[11] Patent Number: 5,500,611
[45] Date of Patent: Mar. 19, 1996

[54] INTEGRATED CIRCUIT WITH INPUT/OUTPUT PAD HAVING PULLUP OR PULLDOWN

[75] Inventors: Kaushik Popat, Pleasanton; William Ip, Saratoga; David Sherman, Fremont, all of Calif.

[73] Assignee: Cirrus Logic, Inc., Fremont, Calif.

[21] Appl. No.: 316,178

[22] Filed: Sep. 30, 1994

[51] Int. Cl.$^6$ ............................................. H03K 19/0944
[52] U.S. Cl. ............................................. 326/87; 326/57
[58] Field of Search .................................. 326/56, 57, 58, 326/83, 87

[56] References Cited

U.S. PATENT DOCUMENTS

| | | | |
|---|---|---|---|
| 4,680,487 | 7/1987 | Kobayashi | 326/58 |
| 4,697,107 | 9/1987 | Haines | 326/58 |
| 4,746,818 | 5/1988 | Hafner | 326/56 |
| 5,017,813 | 5/1991 | Galbraith et al. | 326/56 |
| 5,331,220 | 7/1994 | Pierce et al. | 326/57 |
| 5,345,556 | 9/1994 | Zapisek | 395/200 |

Primary Examiner—Edward P. Westin
Assistant Examiner—Benjamin D. Driscoll
Attorney, Agent, or Firm—Lowe, Price, LeBlanc & Becker

[57] ABSTRACT

Voltage pullup or pulldown devices of general purpose input/output pads of integrated circuit chips are controlled by signals derived from a core of the chip and which indicate (1) if the pad is to be enabled to output a value and (2) the value of the signal to be outputted. Such devices are controlled to supply different current levels to the input/output terminals as a function of whether the chip is operating in "sleep" and interrupt modes. The device of each pad is disabled when signals or commands are supplied via the pad from the chip to circuitry external to the chip and vice versa.

15 Claims, 5 Drawing Sheets

5,500,611

INTEGRATED CIRCUIT WITH INPUT/OUTPUT PAD HAVING PULLUP OR PULLDOWN

FIELD OF THE INVENTION

The present invention relates generally to integrated circuits having input/output terminals connected to input/output pads having voltage pullup or pulldown devices for the terminals and, more particularly, to an integrated circuit including such devices that are controlled by signals derived from a core of the integrated circuit and which indicate (i) if the pad is to be enabled to output a value and (ii) the value of the signal to be outputted. Another aspect of the invention relates to integrated circuits including such devices that are controlled to supply different current levels to the input/output terminals in response to logic signals derived from the integrated circuit.

BACKGROUND ART

A common configuration for integrated circuits that perform binary signal processing functions is illustrated in FIG. 1, wherein integrated circuit chip 10 is illustrated as including core 12 containing the main logic area where the binary signal processing functions are performed. Signals are coupled from and into core 12 via N identical general purpose input/output pads 14, each connected to one of N input/output pins 16, where N is an integer greater than 1 and typically has a value of 16, 32, or more. Pads 14 are at the periphery of the chip and connected via appropriate bonded leads to pins 16 fixedly connected at the outer edges of a package (not shown) containing the chip. Since all of pads 14 are identical, the description proceeds with regard to a single pad 14.

General purpose input/output pad 14 includes terminal 18 directly connected to pin 16. Terminal 18 is connected to a DC reference voltage at terminal 20 by device 22, which can be either a pullup or pulldown device; for ease of further description, it is assumed that device 22 is a pullup device which, when enabled, tends to maintain terminal 18 at the positive DC voltage at terminal 20. When pullup device 22 is disabled, terminal 18 is free to float and the voltage at terminal 18 is controlled by (1) the voltage supplied to the terminal from pin 16 when a signal is coupled to integrated circuit chip 10 via pin 16 or (2) the voltage at the output of amplifier 24. Pullup device 22, when enabled, has a much greater impedance than the output impedance of amplifier 24 or of the signal source external to chip 10, so the amplifier or the external source can overcome the pullup effects of device 22. When a voltage is supplied to terminal 18 from pin 16, the voltage at terminal 18 is coupled to the input of amplifier 26, having an output coupled to circuitry within core 12.

Core 12 includes addressable register 28 having three memory elements 30, 32 and 34 for each of the N general purpose input/output pads 14. Other portions of core 12 load binary signal levels into memory elements 30, 32 and 34. Memory element 30 stores a binary control signal level indicative of whether pullup device 22 is enabled to couple the voltage at terminal 20 to terminal 18 or if pullup device 22 is to be disabled, in which case terminal 18 can float or is driven to a voltage at an output of a source supplying a signal to terminal 18. Memory element 32 is loaded with a binary value indicative of whether input/output pad 14 is to supply a binary 1 or 0 value to pin 16. In the logic set of the prior art discussed in connection with FIG. 1 and the preferred embodiment of the present invention as described in connection with the remaining figures, binary 1 and 0 values in element 34 are respectively associated with low (ground) and positive (high) voltages, but it is to be understood that other logic sets can be used. (The binary 1 and 0 values of other binary signals are respectively associated with positive high and low (ground) voltages.) The value in storage element 32 is selectively coupled through amplifier 24 to terminal 18 under the control of binary values loaded in memory element 34. To this end, the signal in element 34 is supplied to inverting power supply terminal 36 of tristate amplifier 24 so that when the signal in element 34 has a low voltage (associated with a binary 1 value) the amplifier is enabled and has a low output impedance serving as a voltage source for a positive (binary 0 value) voltage and a low (binary 1 value) voltage determined by the binary value of the signal in element 32. When a binary 3 is in element 34, element 30 is usually loaded with a binary 0 to disable pullup device 22. When a binary 0 is in element 34, amplifier 24 is disabled, has a high output impedance and an output voltage that is independent of the binary signal in element 32.

with this prior art arrangement, the signals in storage elements 30 and 34 both have binary 0 values to disable pullup device 22 and amplifier 24 when a signal is supplied to pin 16 from circuitry external to integrated circuit 10 so the voltage at terminal 18 is equal to the voltage supplied to it from external circuitry via pin 16. In addition, pullup device 22 may be enabled for some types of input to pin 16 from external sources, e.g., (1) if an external switch is tied to ground, (2) if an external signal is derived by an open drain device, and (3) if no source is connected to the pin, so the pin would otherwise float. When amplifier 24 is disabled by the high voltage in storage element 34 and no signal is to be applied to pin 16 from external circuitry, terminal 18 is maintained at the voltage of terminal 20 by enabling, i.e. activating, pullup device 22 by a high voltage (binary 1 value) in storage element 30.

While the prior art device functions adequately, we have realized that the prior art has the disadvantage of requiring an excess lead wire. We have realized it is not necessary to provide a separate lead wire from storage element 30 to pullup device 22 and that storage element 30 can be eliminated for each input/output pad 14. Since register 28 is usually buried deep in core 12, elimination of the lead wire and of storage element 30 decreases the size of core 12 and therefore of the entire integrated circuit chip 20. Elimination of these parts is significant when it is realized there are frequently 32 or more input/output pads.

we have also realized current and therefore power consumption can be reduced by decreasing the current supplied via the pullup devices during certain operating conditions of the core, particularly for a low power, i.e. sleep, mode of operation of the integrated circuit chip and/or when the integrated circuit chip is responsive to an externally derived interrupt signal.

It is, accordingly, an object of the present invention to provide a new and improved integrated circuit chip having a core for performing binary signal processing functions as well as general purpose input/output pads, wherein the volumetric requirements of the integrated circuit chip are reduced.

An additional object of the invention is to provide a new and improved integrated circuit chip including a core for performing binary signal processing functions in combination with a general purpose input/output pad having a pullup or pulldown device that is controlled by the same signals that control other components in the input/output pad so as to reduce the number of leads between the core and the input/output pad.

An additional object of the invention is to provide a new and improved integrated circuit having input/output pads including pullup or pulldown devices that are operated at relatively low current levels when the integrated circuit is operated under certain operating conditions, e.g. low power (sleep) and/or interrupt conditions.

THE INVENTION

Certain of these objects are achieved by providing an integrated circuit chip comprising N input/output pads, one for each of N pins of an integrated circuit package in which the chip is to be located, wherein pad i has a first terminal adapted to be connected to pin i, where N is an integer greater than 1 and i is selectively 1 ... N. Core circuitry for performing binary signal processing functions includes circuitry for deriving a first binary signal having a level for determining the value of an output bit to be coupled through pad i to the first terminal of pad i and a second binary signal having a level for controlling whether or not an output signal is to be coupled from pad i to circuitry external to the integrated circuit chip. Pad i includes a device for selectively pulling the first terminal of pad i to a voltage at a second terminal in response to the levels of the first and second binary signals for pad i, and further circuitry for causing the voltage at the first terminal of pad i to be at different predetermined voltages respectively associated with first and second binary values in response to the first signal for pad i respectively signifying that the first and second binary values are to be coupled to pin i from the chip and the second signal for pad i signifying that pad i is to be enabled for outputting a signal. The pulling device of pad i responds to the first and second signals for (1) pulling the voltage at the first terminal of pad i to the voltage at the second terminal to prevent floating of the first terminal of pad i when no signal is to be applied to the first terminal of pad i by the further circuitry or by circuitry external to the integrated circuit and (2) decoupling the first terminal of pad i from the second terminal so the voltage at the first terminal of pad i is not controlled by the voltaic at the second terminal when a signal is to be applied to the terminal of pad i from circuitry external to the integrated circuit or by the further circuitry.

Other objects are achieved by providing an integrated circuit chip comprising a core for performing binary signal processing functions and for deriving binary output signals in combination with a pad at the periphery of the chip connected to be responsive to the binary output signals and including a first terminal for supplying a signal to circuitry external to the chip. The pad includes a device for selectively pulling the first terminal to a predetermined DC voltage at a second terminal. The device is connected between the first and second terminals and is responsive to the binary output signals for supplying currents $i_1$ and $i_2$ to the first terminal at different times and for decoupling currents $i_1$ and $i_2$ from the first terminal so the voltage at the first terminal is not controlled by either of the currents $i_1$ or $i_2$ at other times, where $i_1 \gg i_2$.

In certain embodiments one of the binary output signals derived by the core has first and second values to respectively indicate the core is operating in first and second modes. The device is connected to be responsive to said one binary output signal to supply current $i_2$ from the second terminal to the first terminal when said one binary output signal indicates the core is operating in the first mode and to selectively supply current $i_1$ from the second terminal to the first terminal when said one binary output signal indicates the core is operating in the second mode. In a preferred embodiment, the modes are high and low power levels.

Further objects are achieved with an integrated circuit chip for performing binary signal processing functions and deriving binary output signals. A pad at the periphery of the chip connected to be responsive to the binary output signals includes a first terminal for supplying a signal to circuitry external to the chip. The pad includes a device for selectively pulling the first terminal to a predetermined DC voltage at a second terminal. The device is connected between the first and second terminals and is responsive to the binary output signals for supplying a current from the second terminal to the first terminal and for decoupling the first terminal from the second terminal so the voltage at the first terminal is not controlled by the voltage at the second terminal.

Circuitry on tho pad detects that an interrupt command has been coupled to the first terminal of the pad from circuitry external to the chip. The device is activated so the first terminal is decoupled from the second terminal, whereby the voltage at the first terminal is not controlled by the voltage at the second terminal when the chip is operating in the interrupt mode as a result of the interrupt command being coupled to the first terminal of the pad from circuitry external to the chip. Thereby, the voltage at the first terminal is controlled by the voltage associated with the interrupt command coupled to the first terminal of the pad.

The above and still further objects, features and advantages of the present invention will become apparent upon consideration of the following detailed descriptions of specific embodiments thereof, especially when taken in conjunction with the accompanying drawings.

DESCRIPTION OF THE PREFERRED EMBODIMENTS

Figure 1:
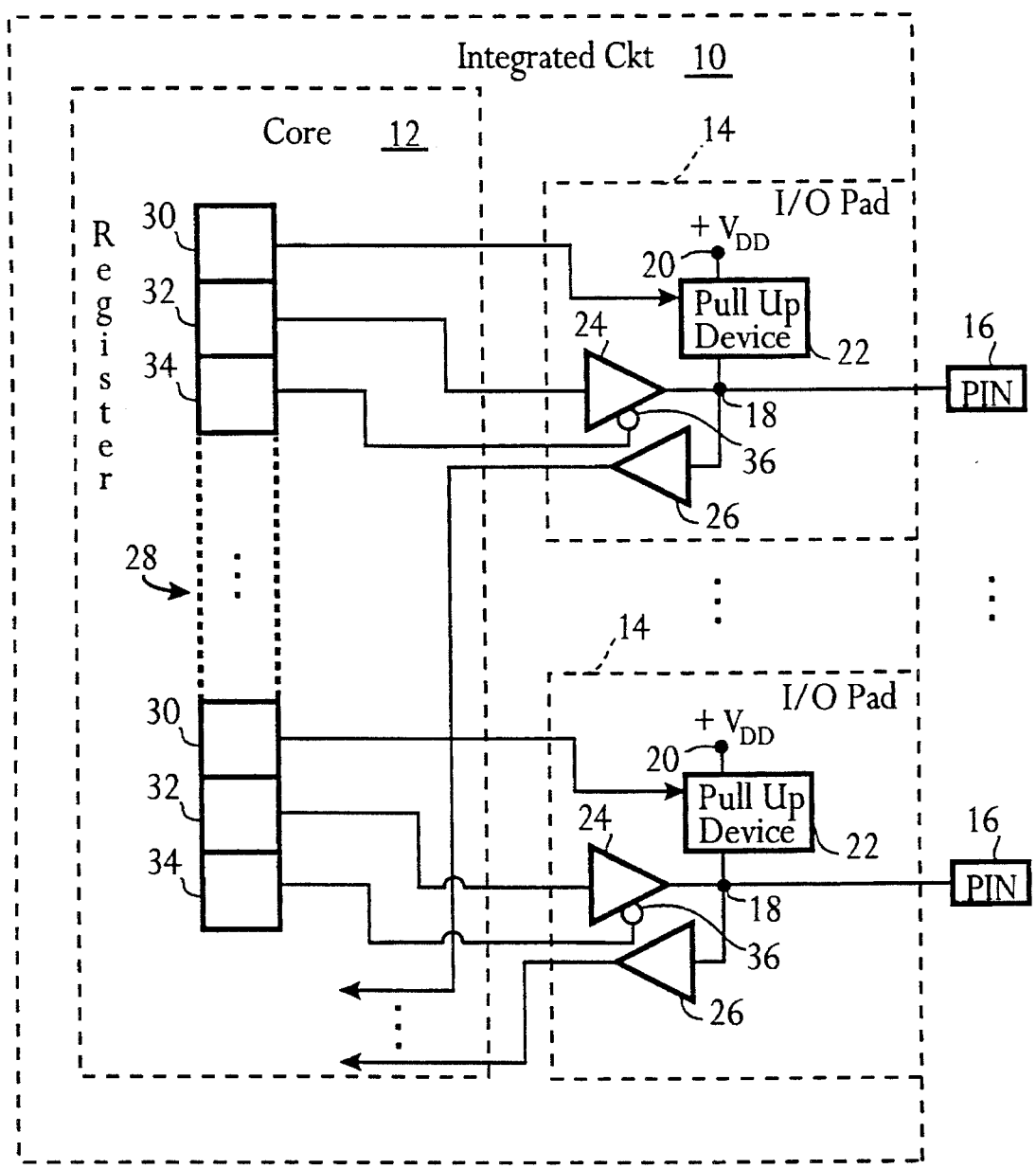
FIG. 1, as described supra, is a circuit diagram of a prior art integrated circuit including a core and input/output pads, each having a pullup device.
Figure 2:
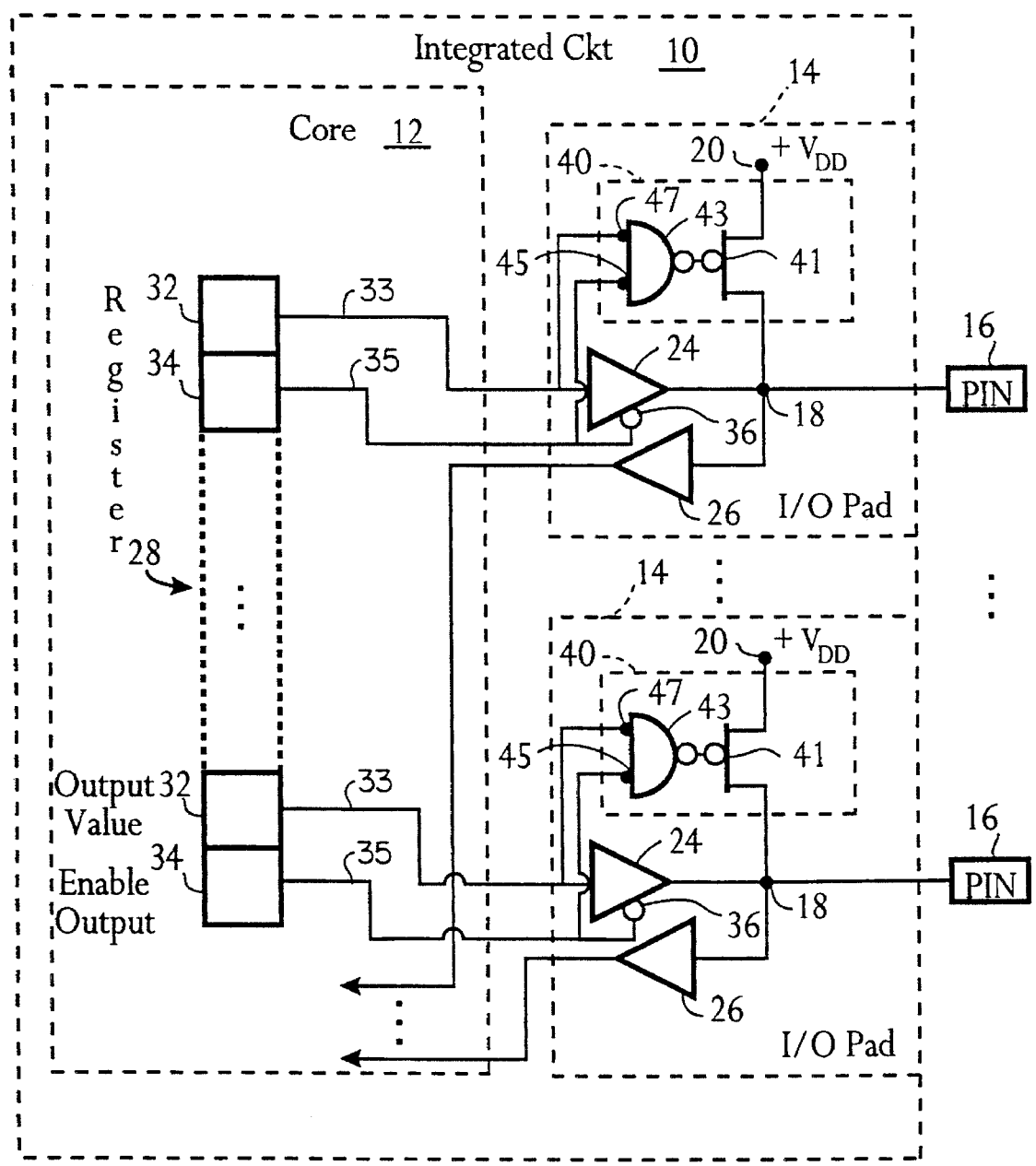
FIG. 2 is a circuit diagram of an integrated circuit including one preferred aspect of the invention, wherein a pullup device is controlled by signals representing the value of a binary level to be supplied to an input/output terminal of the pad and a signal indicative of whether the pad is to be used for input or output purposes.

Reference is now made to FIG. 2 of the drawing, wherein the integrated circuit chip illustrated in FIG. 1 is modified in accordance with one aspect of the invention so register 28 includes, for each general purpose input/output pad 14, only two storage elements, namely storage elements 32 and 34 for respectively storing the output value to be supplied to terminal 18 and an indication as to whether input/output pad 14 is to be activated to couple signals from integrated circuit 10 via terminal 18 and pin 16 to circuitry external to the integrated circuit or if signals are to be coupled into core 12 from circuitry external of the integrated circuit via pin 16 and terminal 18. Thereby only two leads 33 and 35 carry signals from core 12 of integrated circuit chip 10 to each of input/output pads 14. While each of the pads includes additional leads, the pads are at the periphery of integrated circuit chip 10 and the added leads on the pads do not have a material effect on the size of the integrated circuit chip. Hence, storage element 30 and the lead associated therewith for each of the N input/output pads 14 is eliminated to reduce the requirement for three leads to extend between core 12 and each of input/output pads 14, with resulting decreases in the volumetric requirements of integrated circuit chip 10. The signals in storage elements 32 and 34 are coupled to the input and power supply terminals of amplifier 24 in the same manner described supra in connection with the prior art of FIG. 1.

In FIG. 2, pullup device 40 is quite different from the prior art pullup device of FIG. 1. Pullup device 40 includes logic circuitry responsive to the signals loaded by core 12 into memory elements 32 and 34, as coupled to the pullup device. Logic circuitry in pullup device 40 responds to the signals in memory elements 32 and 34 so that the pullup device is enabled only when plus (i.e., high) voltages are in both of storage elements 32 and 34. Because of the high impedance of pullup device 14, when enabled, the voltage at terminal 18 and pin 16 is controlled by the voltage of an external, low impedance active source driving the pin or the voltage at terminal 20 if the external source is not in an active state. Thereby floating of terminal 18 and pin 16 is prevented. For all other circumstances, pullup device 14 is disabled, whereby the voltage at terminal 18 (1) is controlled by the output voltage of amplifier 24 (when a low voltage is in element 34 to enable the amplifier) as a function of the voltage in element 32 or (2) floats (when low and high voltages are respectively in elements 32 and 34 and no external source is supplying a signal to pin 16) or (3) is controlled by the voltage of the external source (when low and high voltages are respectively in elements 32 and 34 and an external source is supplying a signal to pin 16). Thereby, terminal 18 and pin 16 rarely float and the voltage thereof is stabilized under virtually all operating conditions.

As illustrated in FIG. 2, pullup device 40 includes normally cut-off field effect transistor (FET) 41 having a source drain path connected between terminals 18 and 20 and a gate electrode responsive to the output of NAND gate 43. Gate 43 includes non-inverting input terminals 45 and 47 respectively responsive to the signals in storage elements 32 and 34. Thereby, in response to the signals in elements 32 and 34 respectively having high voltage values, the source drain path of FET 41 is enabled and current flows from terminal 20 to terminal 18, to pull terminal 18 to the $+V_{DD}$ DC voltage of terminal 20. Under all other combinations of the signal values in elements 32 and 34, FET 41 is cut off and the voltage at terminal 18 is not controlled by the voltage at terminal 20. The circuit of FIG. 2 thus operates and is constructed in the same manner as the circuit of FIG. 1, except for the noted differences in operation and construction of pullup device 40 relative to pullup device 22 of the prior art and that core 12 must supply binary values to elements 32 and 34 to perform the functions provided by the binary value in element 30.

Figure 3:
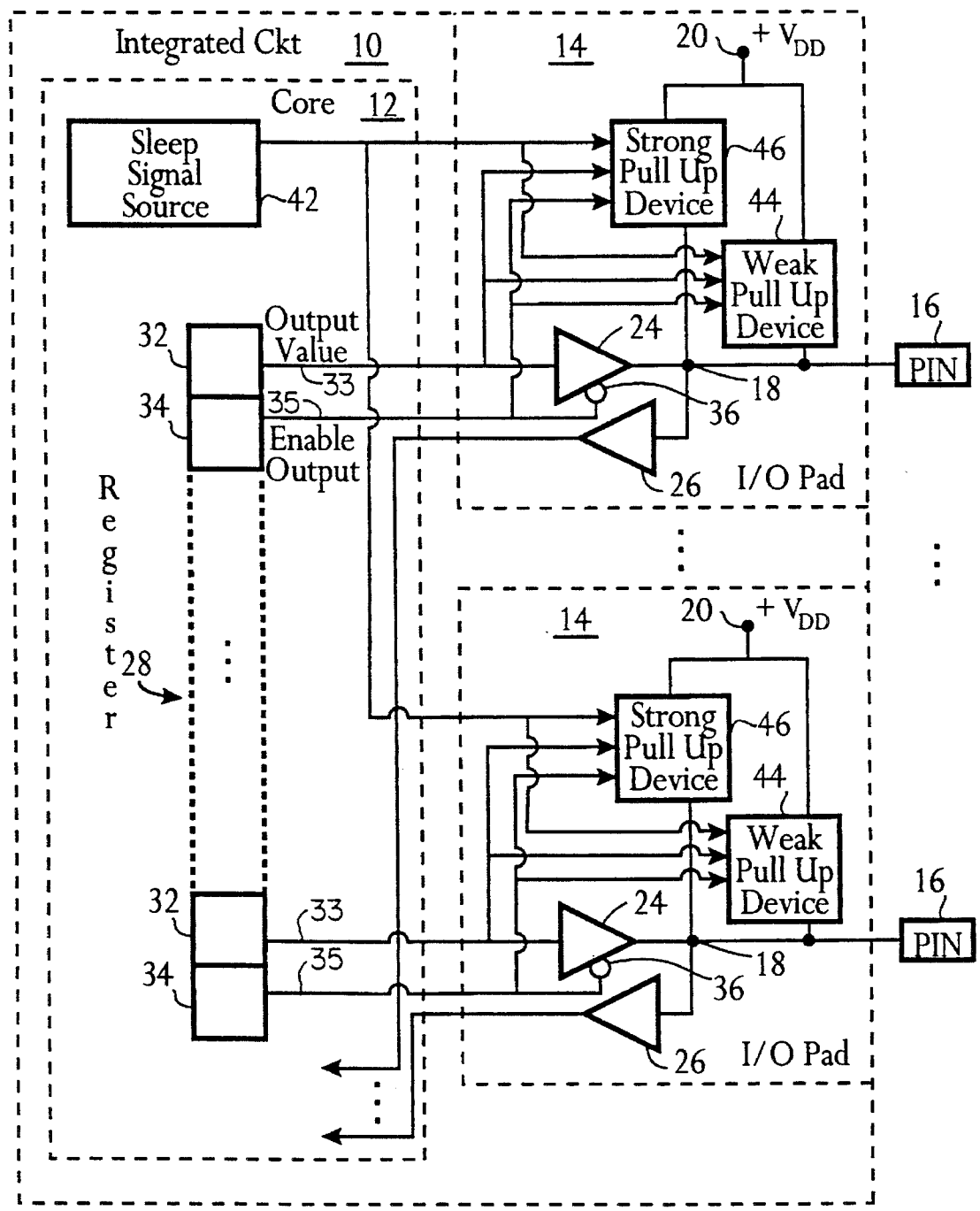
FIG. 3 is a circuit diagram of a modification of the circuit illustrated in FIG. 2 including provisions for changing the current in the pullup device to a relatively low level during low power operation of the integrated circuit.

Reference is now made to FIG. 3 of the drawing, a modification of the circuitry illustrated in FIG. 2. The circuit of FIG. 3 is particularly adapted to be used in conjunction with integrated circuit chips that selectively operate in high and low power modes. To this end, core 12 of integrated circuit chip 10 includes conventional sleep signal source 42, which derives binary 1 and 0 levels (high and low voltages) to command the chip to operate in a low power, i.e., sleep, mode and a normal higher power mode, respectively.

To reduce power when integrated circuit chip 10 is in the low power operating mode, the current, $i_2$, supplied to terminal 18 by the DC source at terminal 20 to prevent terminal 18 from floating is reduced relative to the current, $i_1$, which is supplied by terminal 20 to terminal 18 to prevent terminal 18 from floating when the chip is in a high power operating mode. For portable and plug-in integrated circuit chips, the advantages of reducing current, with associated power reduction, are obvious. Low current can be tolerated at terminal 18 from terminal 20 when chip 10 is in a low power state because the likelihood of noise being supplied to terminal 18 at this time is significantly reduced relative to when the chip is operating at high power. For typical high power operation of integrated circuit chip 10, the current supplied to terminal 18 by pullup device 22 or 40, is, e.g., approximately 20 microamps. For typical low power operation of chip 10, the current supplied to terminal 18 by the pullup device of FIG. 3 is reduced significantly, e.g. to approximately 5 microamps.

Figure 4:
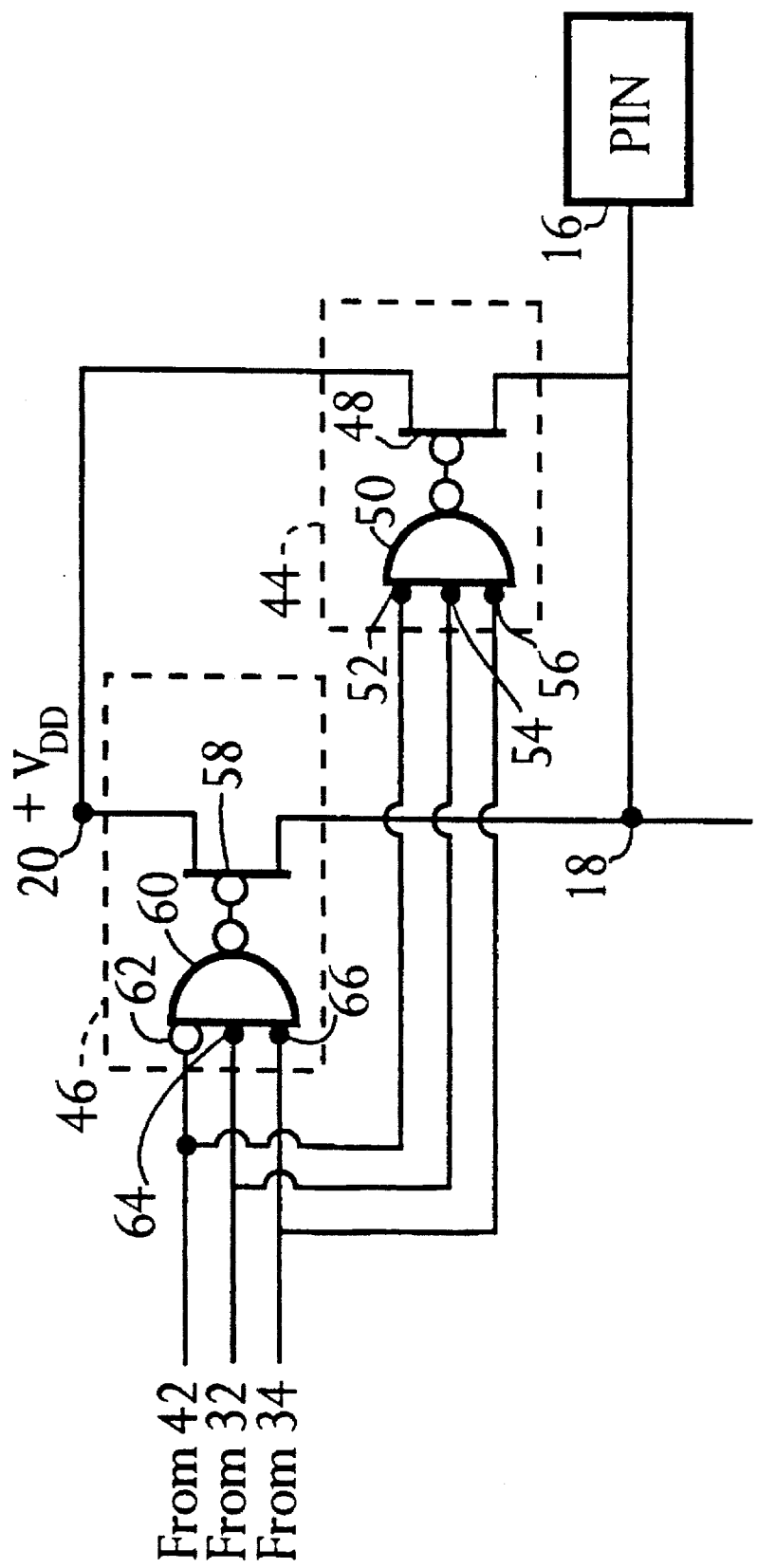
FIG. 4 is a circuit diagram of a pullup device which is particularly adapted to be used in the circuit of FIG. 3.

To these ends, input/output pad 14 is modified to include parallel pullup devices 44 and 46, both driven in parallel by the signals from storage elements 32 and 34 and the output of sleep signal source 42. When enabled, pullup device 44 can supply only the low current level from terminal 20 to terminal 18; when enabled, pullup device 46 can supply only the high current level from terminal 20 to terminal 18. In response to sleep signal source 42 deriving a binary 1 output level, indicative of integrated circuit chip 10 being in a low power state, pullup device 44 can be enabled to the exclusion of pullup device 46, In response to sleep signal source 42 having a binary 0 level, indicative of integrated circuit 10 being in a relatively high power operating mode, pullup device 46 can be enabled to the exclusion of pullup device 44. Pullup devices 44 and 46 respond to the signals in storage elements 32 and 34 in the same manner that pullup device 40 responds to these signals. In addition, further control for pullup devices 44 and is provided by the level of the signal derived from source 42. Generally when source 42 is deriving a binary 1, (high voltage) level, high voltage values are respectively loaded by core 12 into elements 32 and Reference is now made to FIG. 4 of the drawing, a circuit diagram of pullup devices 44 and 46, in combination with terminals 20 and 18. Low current pullup device 44 and high current pullup device 46 respectively include normally cut-off FETs 48 and 58. When the FET 48 source drain path is enabled it has a considerably higher resistance between terminals 18 and 20 than the source drain resistance of enabled FET 58; e.g. the resistance ratio is about 4:1. The relatively high and low source drain resistances of enabled FETs 48 and 58 are provided by proper design of the length to width ratios of the source drain paths of the PETs.

FET 48 is activated from the normally cut-off state to an enabled conducting state in response to a binary 0 being derived by NAND gate 50, having an output connected to the gate electrode of PET 48. Gate 50 includes non-inverting input terminals 52, 54 and 56 respectively connected to be responsive to the outputs of sleep signal source 42, the binary signal in storage element 32, and the binary signal in storage element 34. Thus low power, i.e., weak, pullup device 44 is enabled and current $i_2$ flows from terminal 20 to terminal 18 only when chip 10 is in the sleep mode, a positive voltage is in element 32 and a positive voltage is in element 34 to disable amplifier 24. If external circuitry supplies a signal to pin 16 while chip 30 is in the low power mode, the signal has sufficient current to overcome the effect of weak pullup device 44 and is coupled to core 12 to remove chip 10 from the sleep state.

FET 58 includes a gate electrode connected to be responsive to the output of NAND gate 60. Gate 60 includes inverting input terminal 62 and non-inverting input terminals 64 and 66, respectively connected to be responsive to the output signal of source 42, the signal in element 32 and the signal in element 34. The source drain path of FET 58 is activated from its normally disabled state to an enabled state only in response to the voltage levels at terminals 62, 64 and 66 respectively having values of low, high and high values. Thus, high power, i.e., strong, pullup device 46 is enabled and current $i_1$ flows from terminal 20 to terminal 18 only when chip 10 is in a normal (non-sleep) mode, a high voltage is in element 32 and a high voltage is in element 34 to disable amplifier 24.

When the source drain path of either of FETs 48 or 58 is enabled, the voltage at terminal. 18 does not float with respect to the voltage at terminal 20. Conversely, when the source drain paths of FETs 48 and 58 are both disabled, the voltage at terminal 18 is driven to a binary value determined by active signal sources which are external to integrated circuit 10 and connected to terminal 18 or by the output of amplifier 24.

Figure 5:
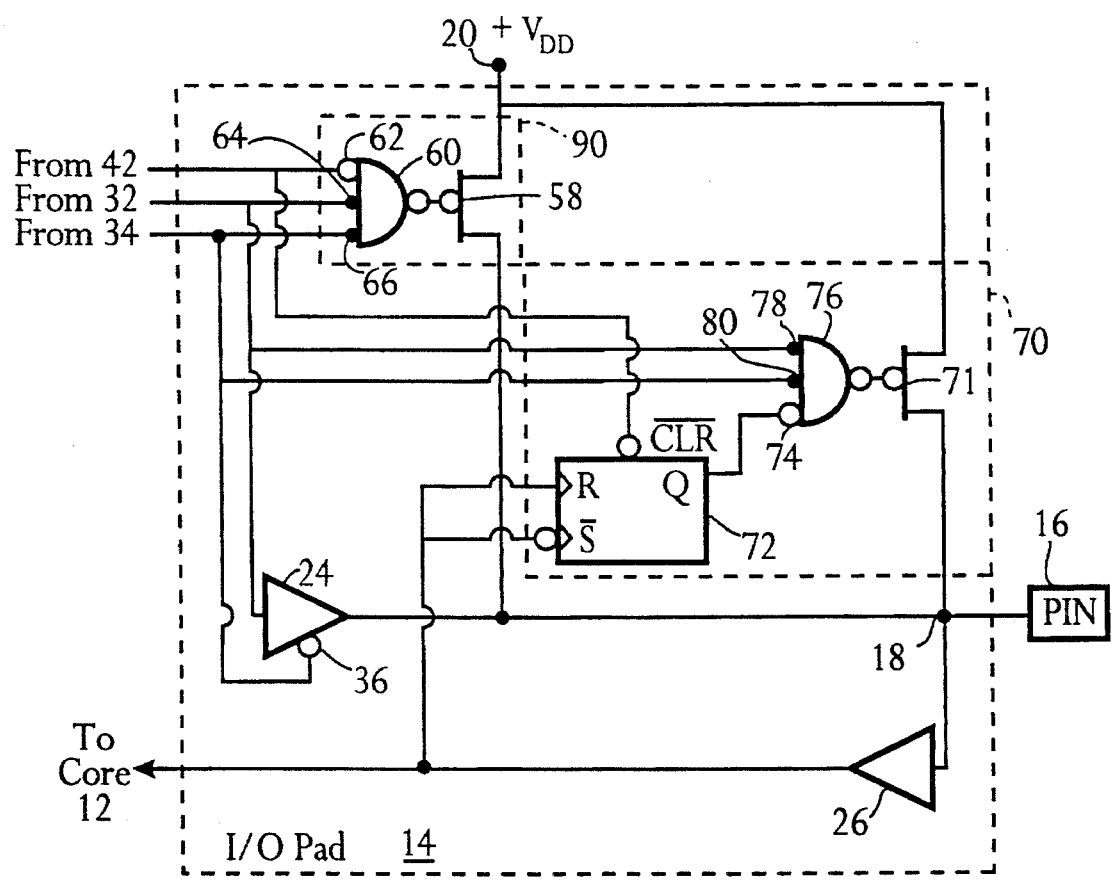
FIG. 5 is a modification of the circuit illustrated in FIG. 3, particularly adapted to be responsive to interrupt signals supplied by circuitry external of the integrated circuit to a pin connected to a pullup device.

According to a further aspect of the invention, illustrated in FIG. 5, power consumption of integrated circuit 10 is also reduced in response to an interrupt signal being supplied by an external circuit via pin 16 of at least one general purpose input/output pad 14 to integrated circuit 10. Interrupt signals from circuitry external to integrated circuit 10 have an active state as a result of a negative going transition from a normal positive DC level to a low voltage. In response to the interrupt signal being supplied to pin 16 of a particular input/output pad 14, a negative going leading edge thereof is detected by circuitry in the input/output pad, causing the pullup device of that pad to be disabled so the voltage at terminal 18 of that pad is held at the voltage associated with the interrupt command, while the chip is in the low power mode. While this feature could be performed in the high power mode, there is little advantage in disabling the pullup device for the short duration while chip 10 is in the interrupt mode simultaneously with the chip being in the high power mode. While chip 10 is in the low power mode, weak and strong pullup devices 70 and 90 on the pad which responded to the externally derived interrupt are maintained in a disabled state until the interrupt signal is no longer being supplied to the pad by the external interrupt source.

Device 70 differs somewhat from low power (weak) pullup device 44 (FIG. 4) while strong pullup device 90 is the same as strong pullup device 46, so no further description thereof is necessary. Pullup device 70 includes FET 71 that corresponds with PET 48 of pullup device 44. The pad illustrated in FIG. 5 is responsive to an interrupt command source derived from an external source, as coupled to terminal 18 via pad 16, but it is not necessary for all of the input/output pads on integrated circuit chip 10 to be responsive to externally derived interrupt command sources.

The negative going leading edge and positive going trailing edge of the interrupt pulse coupled to pin 16 by circuitry external to integrated circuit chip 10 are detected by flip-flop 72, connected to the output of amplifier 26. Flip-flop 72 includes inverting set (S), non-inverting reset (R), and inverting clear (CLR) input terminals, as well as Q output terminal. The inverting set and reset input .terminals of flip-flop 72 are connected in parallel to the output of amplifier 26 so the flip-flop is respectively driven to the set and reset states by negative going leading and positive Going trailing edges of the interrupt signal from an external source. The inverting clear input terminal of flip-flop 72 is connected to sleep source 42 so the flip-flop is in the reset state when chip 10 is in the normal, non-sleep mode. The Q output terminal of flip-flop 72 is connected to inverting input terminal 74 of NAND gate 76 having non-inverting input terminals 78 and 80 respectively connected to elements 32 and 34. The gate electrode of normally cut off FET 71 in low power (weak) pullup device 70 is connected to be responsive to the output of NAND gate 82.

In response to a negative going transition associated with the beginning of an interrupt command being supplied by an external circuit to pin 16 while the sleep signal has a binary 1 value, flip-flop 72 is set, so NAND gate 76 cannot enable FET 71 of weak pullup device 70. Simultaneously, strong pullup device 90 is disabled because the binary 1 output of sleep indicating source 42 supplied to inverting input terminal 62 of AND gate 60 causes gate 60 to apply a binary 0 to the gate electrode of FET 58 to cut off the FET., Thus, no current flows between terminals 18 and 20, whereby the voltage at terminal 18 is not controlled by the voltage at terminal 20 but is maintained at the voltage supplied to pin 16 by the interrupt source.

When chip 10 is in the high power mode, the negative going transition at the inverting set input of flip-flop 88 has no effect on weak pullup device 70 because source 42 is applying a low voltage to the inverting clear input of the flip-flop to prevent enabling of weak pullup device 70.

When the interrupt source external to chip 10 has terminated while the chip is in the sleep mode, the resulting positive going transition at the non-inverting reset (R) input of flip-flop 88 resets the flip-flop so NAND gate 76 can be controlled by the signals in elements 32 and 34. Elements 32 and 34 are respectively programmed to store high voltages while sleep source 42 is deriving a binary 1 value. NAND gate 82 thereby supplies a binary 1 level to the gate electrode of FET 71 to enable weak pullup device 70 so terminal 18 and pin 16 are pulled up to the positive DC voltage at terminal 20 to prevent the pin and terminal 18 from floating. Pullup device 70 remains in this state until there is a change in the state of signal source 42 or an interrupt is again applied to pin 16 from the external source. The interrupt from the external source overcomes the effect of weak pullup device 70 because the external source has a much lower output impedance than the source drain resistance of FET 71 when the FET is enabled and supplies much more current to terminal 18 than is supplied to this terminal via the source drain path of FET 71. The negative going leading edge of the interrupt disables weak pullup device 70, as described supra, as does a change in the value of the signal derived from source 42.

While there have been described and illustrated several specific embodiments of the invention, it will be clear that variations in the details of the embodiments specifically illustrated and described may be made without departing from the true spirit and scope of the invention as defined in the appended claims. For example, both of the parallel FETs forming the pullup devices of FIGS. 4 and 5 can be enabled during strong pullup operation with appropriate change in the logic of these figures.

What is claimed:

1. An integrated circuit chip comprising N input/output pads, one for each of N pins of an integrated circuit package in which the chip is to be located, pad i having a first terminal, the first terminal of pad i adapted to be connected to pin i, where N is an integer greater than 1 and i is selectively 1 . . . N, core circuitry for performing binary signal processing functions, the core circuitry including circuitry for pad i for deriving a first binary signal having a level for determining the value of an output bit to be coupled through the pad to the first terminal of pad i and a second binary signal having a level for controlling whether or not an output signal is to be coupled from pad i to circuitry external to the integrated circuit chip; pad i including a device for selectively pulling the first terminal of pad i to a voltage at a second terminal in response to the levels of the first and second signals for pad i; further circuitry for causing the voltage at the first terminal of pad i to be at different predetermined voltages respectively associated with first and second binary values in response to the first signal for pad i respectively signifying that the first and second binary values are to be coupled to pin i from the chip and the second signal for pad i signifying that pad i is to be enabled for outputting a signal; the pulling device of pad i responding to the first and second signals for (1) pulling the voltage at the first terminal of pad i to the voltage at the second terminal to prevent floating of the terminal of pad i when no signal is to be applied to the first terminal of pad i by the further circuitry or by circuitry external to the integrated circuit and (2) decoupling the first terminal of pad i from the second terminal so the voltage at the first terminal of pad i is not controlled by the voltage at the second terminal when a signal is to be applied to the terminal of pad i from circuitry external to the integrated circuit or by the further circuitry.

2. The integrated circuit chip of claim 1 wherein the core circuitry includes a signal source for selectively causing the chip to operate at high and low power modes, the device of pad i including circuitry responsive to the high and low power modes signal source for supplying a lower current to the terminal of pad i when the low power operating mode is signalled than when the high power operating mode is signalled when the voltage at the first terminal of pad i is pulled to the voltage at the second terminal.

3. The integrated circuit chip of claim 2 wherein the circuitry of pad i responsive to the signal source for the high and low power modes includes first and second parallel devices for selectively pulling the first terminal of pad i to the voltage at the second terminal, the first device having a larger resistance than the second device and being selectively enabled when the low power mode is signalled, the second device being selectively enabled when the high power mode is signalled and being incapable of being enabled when the low power mode is signalled.

4. The integrated circuit chip of claim 2 wherein one of the pads includes a detector for predetermined voltage variations coupled to the first terminal of the one pad from circuitry external to the integrated circuit, the detector responding to the predetermined voltage variations for disabling the device of the one pad so the voltage at the first terminal of the one pad is not controlled by the voltage at the second terminal.

5. The integrated circuit chip of claim 4 further including circuitry for selectively causing the device to be re-enabled so the voltage at the first terminal of pad i can be selectively controlled by the voltage at another terminal after a signal associated with the voltage variations has been recognized by the core circuitry as having been terminated.

6. The integrated circuit chip of claim 1 wherein the chip is included in an integrated circuit package including the N pins.

7. The integrated circuit chip of claim 1 wherein one of the pads includes a detector for predetermined voltage variations coupled to the first terminal of the one pad from circuitry external to the integrated circuit, the detector responding to the predetermined voltage variations for disabling the device of the one pad so the voltage at the first terminal of the one pad is not controlled by the voltage at the second terminal.

8. The integrated circuit chip of claim 7 further including circuitry for selectively causing the device to be re-enabled so the voltage at the first terminal of pad i can be selectively controlled by the voltage at another terminal after a signal associated with the voltage variations has been recognized by the core circuitry as having been terminated.

9. An integrated circuit chip comprising a core for performing binary signal processing functions and for deriving binary output signals, a pad at the periphery of the chip connected to be responsive to the binary output signals and including a first terminal for supplying a signal to circuitry external to the chip, the pad including a device for selectively pulling the first terminal to a predetermined DC voltage at a second terminal, the device being connected between the first and second terminals and being responsive to the binary output signals for supplying currents $i_1$ and $i_2$ to the first terminal at different times and for decoupling currents $i_1$ and $i_2$ from the first terminal so the voltage at the first terminal is not controlled by either of the currents $i_1$ or $i_2$ at other times, where $i_1 \gg i_2$;

wherein one of the binary output signals derived by the core has first and second values to respectively indicate the core is operating in high and low power modes, said device being connected to be responsive to said one binary output signal to supply current $i_2$ from the second terminal to the first terminal when said one binary output signal indicates the core is operating in the low power mode and to selectively supply current $i_1$ from the second terminal to the first terminal when said one binary output signal indicates the core is operating in the high power mode.

10. The integrated circuit chip of claim 9 wherein the chip includes circuitry for detecting than an interrupt command has been coupled to the first terminal of the pad from circuitry external to the chip, the device being activated so the first terminal is decoupled from the second terminal so the voltage at the first terminal is not controlled by the voltage at the second terminal when the core is operating in the interrupt mode as a result of the interrupt command being coupled to the first terminal of the pad from circuitry external to the chip and the voltage at the first terminal is controlled by the voltage associated with the interrupt command coupled to the first terminal of the pad.

11. The integrated circuit chip of claim 10 wherein the circuitry for detecting that an interrupt command has been coupled to the first terminal of the pad from circuitry external to the chip is on the pad.

12. The integrated circuit chip of claim 9 wherein the chip includes circuitry for detecting that an interrupt command has been coupled to the first terminal of the pad from circuitry external to the chip, the device being activated so the first terminal is decoupled from the second terminal so the voltage at the first terminal is not controlled by the voltage at the second terminal when the core is operating in the interrupt mode as a result of the interrupt command being coupled to the first terminal of the pad from circuitry external to the chip and the voltage at the first terminal is controlled by the voltage associated with the interrupt command coupled to the first terminal of the pad.

13. The integrated circuit chip of claim 12 wherein the circuitry for detecting that an interrupt command has been coupled to the first terminal of the pad from circuitry external to the chip is on the pad.

14. An integrated circuit chip comprising a care for performing binary signal processing functions and for deriving binary output signals, a pad at the periphery of the chip connected to be responsive to the binary output signals and including a first terminal for supplying a signal to circuitry external to the chip; the pad including a device for selectively pulling the first terminal to a predetermined DC voltage at a second terminal, the device being connected between the first and second terminals and being responsive to the binary output signals for supplying a current from the second terminal to the first terminal and for decoupling the first terminal from the second terminal so the voltage at the first terminal is not controlled by the voltage at the second terminal, a detector for detecting that an interrupt command has been coupled to the first terminal of the pad from circuitry external to the chip, and circuitry responsive to the detector for activating the device so the first terminal is decoupled from the second terminal so the voltage at the first terminal is not controlled by the voltage at the second terminal when the chip is operating in the interrupt mode as a result of the interrupt command being coupled to the first terminal of the pad from circuitry external to the chip and the voltage at the first terminal is controlled by the voltage associated with the interrupt command coupled to the first terminal of the pad.

15. The integrated circuit chip of claim 14 wherein the pad includes the detector and circuitry.

* * * * *